United States Patent [19]

Washizaki et al.

[11] Patent Number: 5,738,744
[45] Date of Patent: Apr. 14, 1998

[54] METHOD AND APPARATUS FOR CONTINUOUSLY SUPPLYING A CONTINUOUS FILM IN A FILM APPLYING APPARATUS

[75] Inventors: Yoji Washizaki, Saitama; Hiroshi Taguchi, Tokyo, both of Japan

[73] Assignee: Somar Corporation, Tokyo, Japan

[21] Appl. No.: 616,649

[22] Filed: Mar. 15, 1996

[30] Foreign Application Priority Data

Mar. 17, 1995 [JP] Japan ................... 7-058956

[51] Int. Cl.⁶ .................................................. B65H 21/00
[52] U.S. Cl. ................... 156/159; 156/304.3; 156/505; 242/553; 242/555.5; 242/556.1
[58] Field of Search .................. 156/159, 304.3, 156/505, 507, 502; 242/551, 552, 553, 555.5, 555.7, 556.1

[56] References Cited

U.S. PATENT DOCUMENTS

| | | |
|---|---|---|
| 4,025,380 | 5/1977 | Bernardo . |
| 4,113,197 | 9/1978 | Harrington et al. ............... 242/552 X |
| 4,278,489 | 7/1981 | Horsley ............................... 242/552 X |
| 4,566,922 | 1/1986 | Martinez ............................ 156/159 X |
| 4,801,342 | 1/1989 | Wheeler et al. ................... 156/505 X |
| 5,064,488 | 11/1991 | Dickey .............................. 156/304.3 X |
| 5,284,197 | 2/1994 | Cederholm et al. ............... 156/159 X |
| 5,468,321 | 11/1995 | Van Liempt et al. ............... 156/159 |
| 5,487,805 | 1/1996 | Boriani et al. ..................... 156/159 |
| 5,501,763 | 3/1996 | Ueda et al. ....................... 242/552 X |

FOREIGN PATENT DOCUMENTS

| | | |
|---|---|---|
| A-0 436 065 | 7/1991 | European Pat. Off. . |
| 3-15131 | 2/1991 | Japan . |
| 3-158348 | 7/1991 | Japan ............................. 242/552 |

*Primary Examiner*—Mark A. Osele
*Attorney, Agent, or Firm*—Oliff & Berridge, P.L.C.

[57] ABSTRACT

A method and apparatus in which a succession of continuous films each composed of a support film, a photosensitive resin layer and a cover film laminated one above another are joined end to end and fed continuously while allowing the cover film to be separated. While the trailing end of a preceding continuous film is held by suction on a first suction device, the leading end of a succeeding continuous film drawn out from a succeeding film supply roll is bonded to a part of the adhesive surface of an adhesive single coated tape previously held by suction on a second suction device, and the remaining part of the adhesive surface of the adhesive single coated tape is forced against the trailing end of the preceding continuous film being held on the first suction device to thereby join the leading end and the trailing end via the adhesive single coated tape without forming an overlap.

13 Claims, 14 Drawing Sheets

METHOD AND APPARATUS FOR CONTINUOUSLY SUPPLYING A CONTINUOUS FILM IN A FILM APPLYING APPARATUS

BACKGROUND OF THE INVENTION

1. Field of the Invention

This invention relates to a method of and an apparatus for continuously supplying a continuous film in a film applying apparatus for applying the film to the surface of a base plate such as a printed circuit board, for example.

2. Description of the Related Art

In a process for the manufacture of printed circuit boards used for electronic equipment such as computers, a laminated film consisting of a light-transmissible support film (base film generally represented by a synthetic resin film made from polyester), a photosensitive resin layer and a cover film is applied onto a conductive surface layer of a printed circuit board after the cover film is separated or removed. Then, a circuit pattern film is laid over the laminated film and, thereafter, the photosensitive resin layer is exposed for a predetermined period of time via the circuit pattern film and the light-transmissible support film. Subsequently, the light-transmissible film is removed, and after that the exposed photosensitive resin layer is developed to fabricate an etching mask pattern which is subsequently used to remove an unnecessary portion of the photosensitive resin layer by etching to thereby produce a printed circuit board having a predetermined circuit pattern.

An apparatus used for applying the laminated film is constructed such that a continuous laminated film (rolled film) wound on a film supply roll is first guided to the leading end of a base plate being conveyed by a conveying means, with the photosensitive resin layer located on a base plate side, then tacked or temporarily applied to the leading end of the base plate by a tacking means movable toward and away from the base plate, and thereafter applied, under pressure, to the base plate by a lamination roll while the base plate is being conveyed.

The pressure application or bonding of the film to the base plate is achieved so that the length of application of the film is substantially equal to the length of the base plate. To this end, the supplied film is cut off or severed into pieces of the predetermined application length by a film cutting means disposed on, or adjacent to, the tacking means. The cover film is separated or removed either in front of or alternatively behind the film tacking means.

In another film applying apparatus, a continuous laminated film with a cover film separated previously is fed over a film applying surface of each of successive base plates in synchronism with intermittent conveyance of the base plates, and after a photosensitive resin layer of the continuous film being fed is applied to the film applying surfaces of the base plates being conveyed, the continuous film is cut off or severed at a position between the adjacent base plates.

The laminated film, which is adapted to be supplied by unwinding it from a film supply roll, has a limited winding length on the film supply roll, so that when the film is used by a predetermined length or quantity, the film supply roll must be replaced with a new one. Furthermore, when an unused film length is very small, or when the type, brand or the like of the film to be supplied to a body of the film applying apparatus must be changed according to usage or application, the current film supply roll should be replaced to supply a new film.

In this instance, a core tube on which the continuous film is rolled is removed together with an unused film left thereon, and after that a new film supply roll is loaded on the apparatus.

Conventionally, replacement of the film supply roll requires a manual work achieved such that at the time of replacement of a current film supply roll, the film applying apparatus is stopped, then the current film supply roll is removed, and thereafter the leading end of a film is withdrawn from a new supply roll, then passed successively through a film separating member, through tension rollers and through rollers on a film supply passage, and finally set to the position of lamination rolls.

According to the conventional practice, it takes 10 minutes to replace upper and lower film supply rolls which have been used for 2 hours for unwinding the films therefrom. Due to a large percentage of the preparation time relative to the actual operation time, the time efficiency of the film applying apparatus is relatively low and, hence, the efficiency of the entire line or system is reduced.

A film roll unit for use with a film applying apparatus to facilitate replacement of the film in a short period of time is known as disclosed in Japanese Utility Model Laid-open Publication No. 3-15131. The disclosed film roll unit includes a film supply roll, a cover film take-up roll and guide rolls that are constructed as a single unit and can, therefore, be replaced at one time. However, the film roll unit still has a drawback that it requires a manual operation for set the leading end of a new film and cannot be used with a heavy film roll.

Due to a recent increase in the circuit density of the printed circuit board, the least amount of dust and dirt adhering to the circuit board or the film is liable to produce a defective product. In view of this, the film applying apparatus is installed, in many cases, in a clean space, such as a clean room.

The conventional film applying apparatus requires a manual film setting operation each time the film supply roll is replaced. Since the film setting operation is likely to produce dust and dirt, the film applying apparatus installed in the clean room cannot be started until the amount of dirt and dust is reduced to a desired level after the film setting operation. Accordingly, the efficiency of the conventional film applying apparatus is relatively low.

SUMMARY OF THE INVENTION

With the foregoing problems of the prior art in view, it is an object of the present invention to provide a method and apparatus for continuously supplying a continuous film in a film applying apparatus, which are capable of replacing film supply rolls without interruption of the operation of the film applying apparatus and also automatically joining the trailing end of a preceding film and the leading end of a succeeding film.

To attain the foregoing object, the present invention provides, a method of continuously supplying a continuous film from a film supply roll in a film applying apparatus, of the type wherein a continuous film composed of a support film, a photosensitive resin layer and a cover film laminated one above another is withdrawn from the film supply roll, and after the cover film is separated, the continuous film is pressure-bonded by lamination rolls to a base plate while being conveyed by a conveying means, with the photosensitive resin layer situated on a film applying surface of the base plate, wherein a trailing end of a preceding continuous film unwound from the film supply roll is held at its cover film side by suction on a first suction means at a fixed position, then a leading end of a succeeding continuous film unwound from a succeeding film supply roll is bonded at its support film side to a portion of an adhesive surface of an adhesive single coated sheet while being held at its non-adhesive surface side by suction on a second suction means, and thereafter the remaining portion of the adhesive surface of the adhesive single coated sheet is forced against the support film side of the trailing end of the preceding continuous film to thereby bond the trailing tape end to the adhesive single coated sheet.

The preceding continuous film while being held by suction on the first suction means may be severed transversely at the position of the first suction means to form the trailing end.

Further, a leading end portion of the succeeding continuous film while being held by suction on the second suction means may be severed transversely at the center of the second suction means in the film feed direction to form the leading end, then the succeeding continuous film is held by suction on a third suction means at a position adjacent to that side of the second suction means which is located closer to the axis of the succeeding film supply roll, and while keeping this condition, the leading end portion of the succeeding continuous film is separated from the second suction means and the non-adhesive side of the adhesive single coated sheet is held by suction on the second suction means, and thereafter the separated leading end portion is boned to the adhesive surface of the adhesive single coated sheet on a suction surface of the second suction means.

Furthermore, the adhesive single coated sheet may be forced by the second suction means against the trailing end of the preceding continuous film while being held by suction on the first suction means.

Yet, the second suction means and the succeeding film supply roll are preferably displaced in synchronism with each other, and when the succeeding film supply roll arrives at a set position, the remaining portion of the adhesive surface of the adhesive single coated sheet is forced against the trailing end of the preceding continuous film while being held by suction on the first suction means.

To attain the foregoing object, the present invention further provides, an apparatus for continuously supplying a continuous film from a film supply roll in a film applying apparatus, of the type wherein a continuous film composed of a support film, a photosensitive resin layer and a cover film laminated one above another is withdrawn from the film supply roll, and after the cover film is separated, the continuous film is pressure-bonded by lamination rolls to a base plate while being conveyed by a conveying means, with the photosensitive resin layer situated on a film applying surface of the base plate, wherein comprising first suction means for holding by suction, at a fixed position, the cover film side of a trailing end of a preceding continuous film unwound from a preceding film supply roll held at a set position, second suction means having the same width as the first suction means and capable of holding by suction a non-adhesive side of an adhesive single coated sheet, and transfer means for feeding the second suction means to the position of the first suction means while a leading end of a succeeding continuous film unwound from a succeeding film supply roll is being bonded at its support film side to a longitudinal portion of adhesive surface of an adhesive single coated sheet being held by suction on the second suction means, thereby pressure-bonding the remaining portion of the adhesive surface of the adhesive single coated sheet and the support film side of the trailing end of the preceding continuous film being held by suction on the first suction means.

It is preferable that, the transfer means is capable of holding the succeeding film supply roll in parallel relation to the preceding film supply roll while in the set position and transferring the succeeding film supply roll to the set position, and the second suction means, when arrived at the set position, comes into pressure contact with the first suction means via the adhesive single coated sheet and the preceding and succeeding continuous films.

Further, the apparatus may further include a cylinder device for supporting the second suction means such that the second suction means is reciprocally movable toward and away from the first suction means.

Furthermore, the apparatus, may include a trailing end cutter disposed in confrontation to a film suction surface of the first suction means at the center of the film suction surface and movable in the widthwise direction or the continuous film for severing the preceding continuous film transversely while the preceding continuous film is held by suction on the film suction surface.

Yet, the trailing end cutter may be provided with a movable pressure member movable in the widthwise direction of the film while forcing the trailing end of the preceding continuous film and the leading end of the succeeding continuous film in the direction of the thickness while the trailing and leading ends are being held by suction on the first suction means in such a manner as to form a butt join via the adhesive single coated sheet.

The apparatus, may further include a leading end cutter disposed in confrontation to a film suction surface of the second suction means for severing a leading end portion of the succeeding continuous film transversely at the center of the film suction surface in the film feed direction while the leading end portion is held by suction on the film suction surface.

Furthermore, the apparatus may include a carriage for moving the transfer means in a direction parallel to the axis of rotation of the film supply roll.

The transfer means is provided with third suction means disposed adjacent to that side of the second suction means located closer to the axis of the succeeding film supply roll for holding by suction a portion of the succeeding continuous film located adjacent to that part of the leading end portion of the succeeding continuous film which is located closer to the axis of the succeeding film supply roll and adapted to be held by suction on the second suction means.

The transfer means, as recited in claim 14, may further include a core tube recovery unit disposed below and adjacent to the preceding film supply roll while being set, for receiving the preceding film supply roll when it is released for downward movement when an amount of film left on the preceding film supply roll falls below a predetermined value.

The apparatus may further include a guide plate disposed adjacent to the preceding film supply roll while being set and pivotally movable within a fixed angular range between an inclined position in which the guide plate forms a sloped guide surface for guiding therealong the preceding film supply roll in a downward direction toward the core tube recovery unit, and a retracted position in which the guide plate is held out of contact with the preceding film supply roll.

According to the invention, the trailing end of the preceding film and the leading end of the succeeding film are joined together at their support film sides by an adhesive single coated sheet without making an overlap between the trailing and leading ends of the respective films, so that the film can be supplied to the films applying apparatus without interruption.

It is, therefore, possible to omit a manual operation which is achieved heretofore by passing the leading end of the succeeding film through rolls, a tacking member, a cutter and the like. Owing to little reliance upon manual operation, the arrangement of the present invention is particularly suitable when the film applying apparatus is operated in the clean room.

According to the invention, the preceding continuous film is cut or severed transversely while it is held by suction on the first suction means, so that a trailing end of the preceding film can be readily produced.

According to the invention, a leading end portion of the succeeding continuous film while being held by suction on the second suction means is severed transversely to form a leading end, then while the succeeding film is held by suction on a third suction means at a portion adjacent to the leading end portion, the leading end portion is separated from the second suction means, and an adhesive single coated sheet is held by suction on the second suction means, and thereafter the leading end portion of the succeeding continuous film is bonded to an adhesive surface of the adhesive single coated sheet. This makes it possible to automatically join the leading end of the succeeding continuous film and the trailing end of the preceding continuous film with utmost ease.

According to the invention, the adhesive single coated sheet can be automatically bonded by forcing it by the second suction means against the trailing end of the preceding continuous film while being held by suction on the first suction means.

According to the invention, when the succeeding film supply roll is placed in the set position, the remaining portion of the adhesive surface of the adhesive single coated sheet is simultaneously press-bonded to the trailing end of the preceding continuous film, with the leading end of the succeeding continuous film bonded to the adhesive surface.

According to the invention recited, the trailing end of the preceding continuous film and the leading end of the succeeding continuous film are continuously and automatically joined by bonding at their support film sides via the adhesive single coated sheet, so that the film applying apparatus is supplied with a continuous film without interruption. This makes it possible to omit a manual setting work which would otherwise be achieved to set the leading end of the succeeding continuous film relative to the rolls, the applying member and the cutter. The operation efficiency of the apparatus can therefore be improved.

According to the invention, when the succeeding film supply roll is transferred to the set position by the transfer means, the trailing end of the preceding continuous film while being held by suction on the first suction means is automatically bonded to the remaining portion of the adhesive surface of the adhesive single coated sheet being held by suction on the second suction means.

According to the invention, the cylinder device forces the second suction means against the first suction means to thereby pressure-bond the adhesive single coated sheet and the films.

According to the invention, the preceding continuous film is cut to form a trailing end by means of the trailing end cutter disposed in confrontation to the first suction means.

According to the invention, the adhesive single coated sheet can be firmly bonded to the trailing end of the preceding continuous film and the leading end of the succeeding continuous film by means of the movable pressure member which is associated with the trailing end cutter movable in the widthwise direction of the films.

According to the invention, by means of a leading end cutter provided in confronting relation to the second suction means, the leading end portion of the succeeding continuous film is cut or severed to form a leading end.

According to the invention, the transfer means is movable toward and away from the axis of rotation of the film supply roll. Thus, while the transfer means is held in a laterally retracted off-line condition, the next film supply roll can be set, and the leading end of the continuous film can be unwound from the same film supply roll and set on the adhesive surface of the adhesive single coated sheet while being held by suction on the second suction means.

According to the invention, by virtue of a third suction means disposed adjacent to that side of the second suction means located closer to the axis of the film supply roll, the leading end of the succeeding continuous film which has been formed by severing can be separated from the second suction means while the succeeding continuous film is held by suction on the third suction means, and the adhesive single coated sheet can also be held by suction on the second suction means. The separated leading end of the succeeding continuous film is then bonded to the adhesive surface of the adhesive single coated sheet. These operation can he readily achieved by the use of the second and third suction means.

According to the invention, since the transfer means is provided with a core tube recovery unit, the core tube of the preceding film supply roll is released before the succeeding film supply roll is set. The thus released preceding film supply roll is recovered, and thereafter, the succeeding film supply roll is set.

According to the invention, when the preceding film supply roll is released for recovery, the guide plate guides the released preceding film supply roll in a downward direction toward the core tube recovery unit. The core tube of the preceding film supply roll can therefore be recovered smoothly and reliably without producing undue impact force. Especially, since the core tube recovery unit is provided on the transfer means, the core tube of the preceding film supply roll can readily be recovered through a single step of operation achieved when the succeeding film supply roll is set.

DETAILED DESCRIPTION OF THE PREFERRED EMBODIMENTS

A preferred embodiment of the present invention will be described below in greater detail with reference to the accompanying sheets of drawings.

Figure 1:
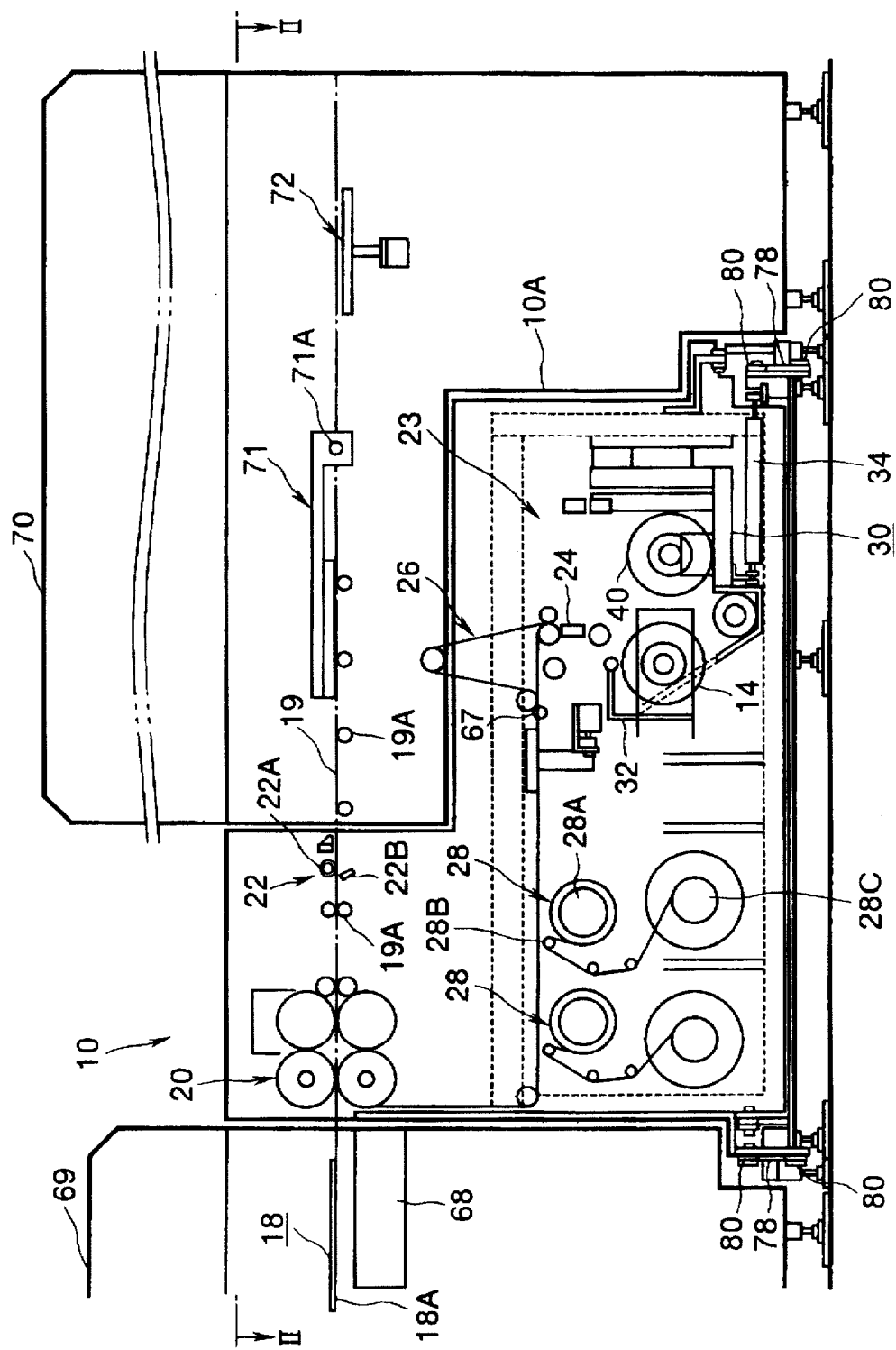
FIG. 1 is a schematic side view of one embodiment of a film applying apparatus incorporating a continuous film-supplying apparatus according to the present invention.
Figure 2:
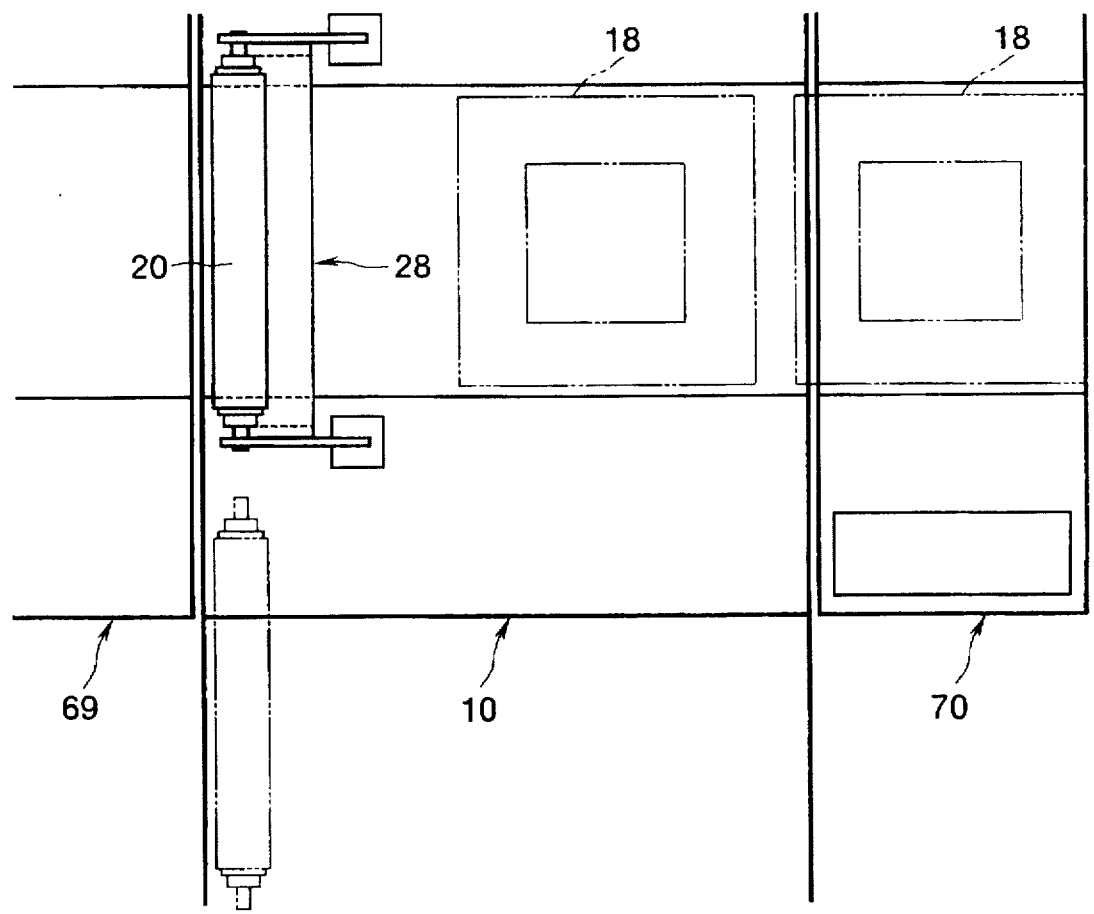
FIG. 2 is a schematic plan view of FIG. 1.
Figure 6:
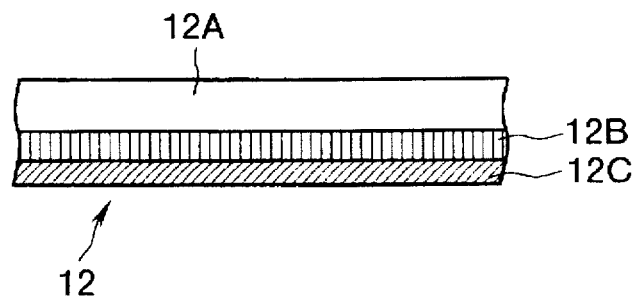
FIG. 6 is a cross-sectional view showing on enlarged scale a film to be supplied by the continuous film-supplying apparatus of the present invention.

As shown in FIGS. 1 and 2, a film applying apparatus 10 pertaining to the embodiment of this invention is constructed such that a continuous film 12 consisting of a light-transmissible support film 12A, a photosensitive resin layer 12B and a cover film 12C laminated one above another, as shown in FIG. 6, is withdrawn from a film supply roll 14, and after the cover film 12C is separated, the film 12 is continuously press-bonded by lamination rolls 20 to each of a series of base plates 18, with the photosensitive resin layer 12B situated on a downwardly facing film applying surface 12A of each base plate 18, while the base plates 18 are conveyed intermittently at predetermined intervals of spaces. The film 12 is cut or severed by a rotary cutter 22 in the widthwise direction at a space between two adjacent ones of the base plates 18.

The film supply roll 14 is replaced by a new one by means of a continuous film-supplying apparatus 23 so that the film 12 can be supplied to the film applying apparatus 10 without interruption.

The film 12 unwound from the film supply roll 14 is passed successively through a first suction unit or device 24 and an accumulator 26, and after the cover film 12C is separated or removed by one of a pair of cover-film separating units or devices 28, 28 it is continuously supplied to the lamination rolls 20 with the photosensitive resin layer 12B facing upwardly.

Figure 3:
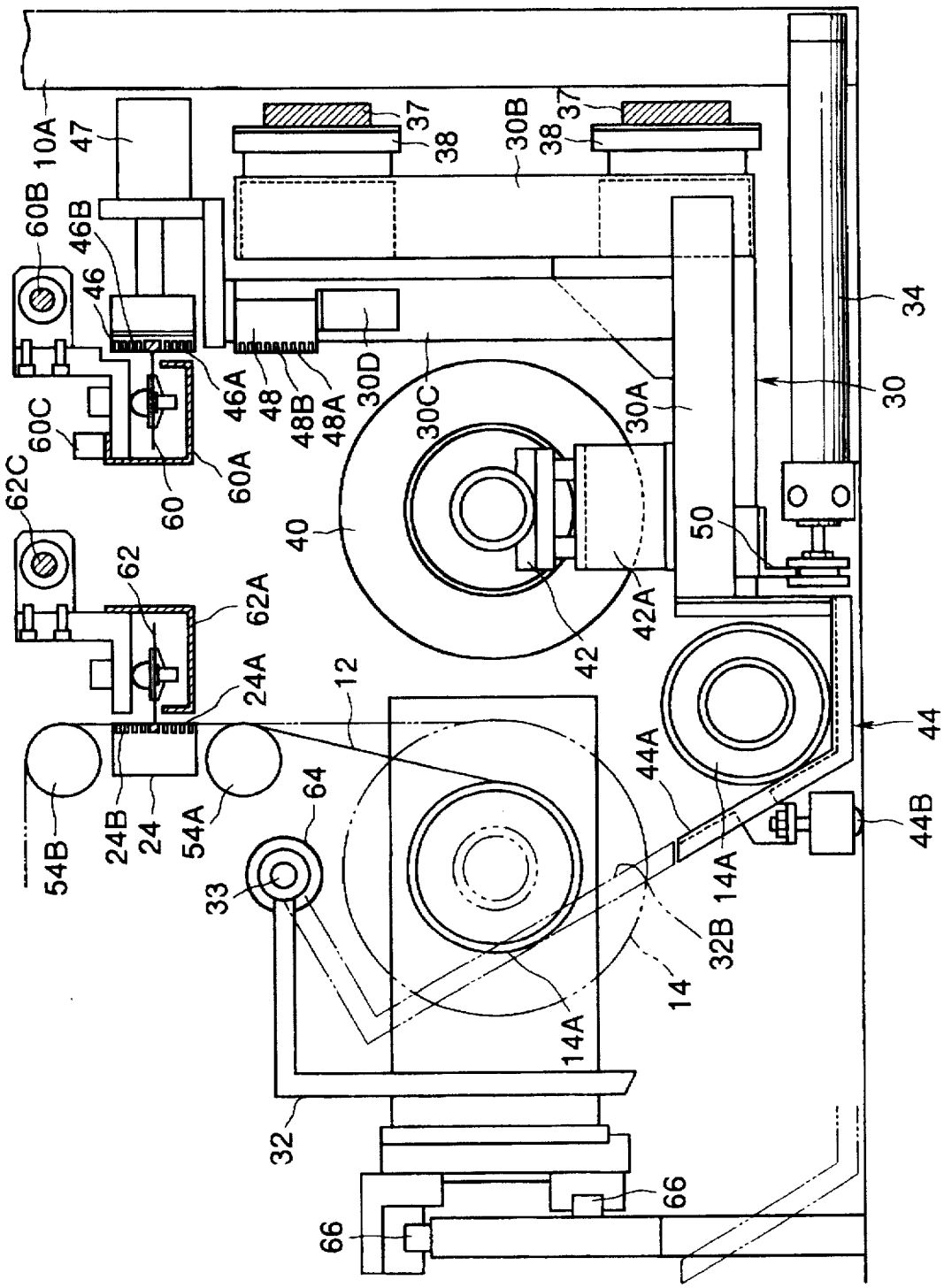
FIG. 3 is a cross-sectional view showing on enlarged scale the continuous film-supplying apparatus of the same embodiment.

The continuous film-supplying apparatus 23, as illustrated on enlarged scale in FIG. 3, comprises the first suction device 24, the accumulator 26, a replacing roll carriage 30, a guide plate 32, and an air cylinder 34 driven to reciprocate a horizontal table 30A in the left and right directions on FIGS. 1 and 3. The horizontal table 30A forms a part of the replacing roll carriage 30.

The replacing roll carriage 30 includes a frame 30B supported via a pair of upper and lower rails 38, 38 on a pair of upper and lower bars 37, 37 attached to a side wall of a housing 10A of the film applying apparatus 10 so that the frame 30B is horizontally movable in a direction perpendicular to the sheet of FIG. 3. Thus, the replacing roll carriage 30 can be horizontally withdrawn from the housing 10A of the film applying apparatus 10 in a lateral direction relative to the film feed direction.

Figure 4:
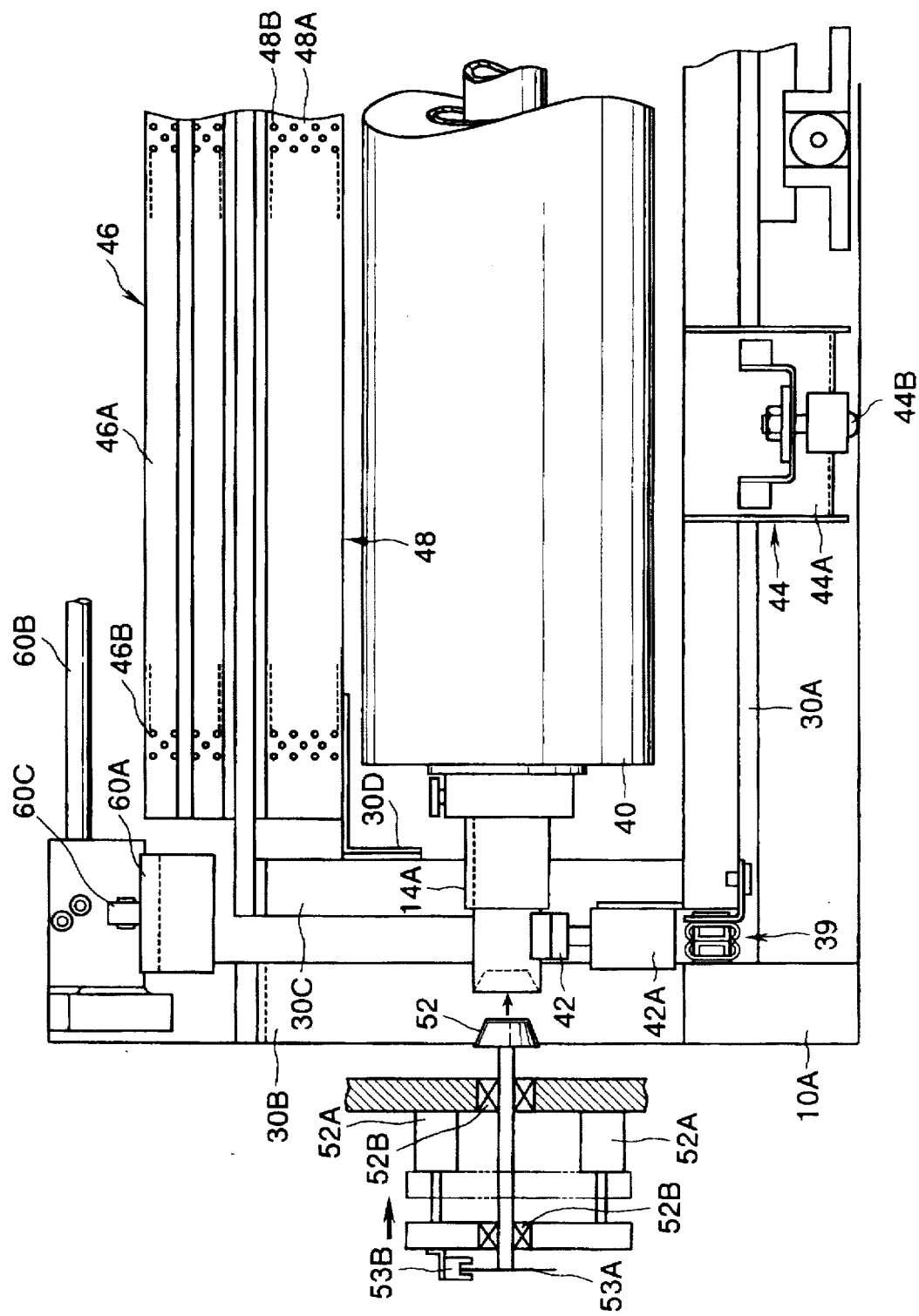
FIG. 4 is a front elevational view of FIG. 3.

As shown in FIG. 4, the horizontal table 30A of the replacing roll carriage 30 is movably supported via a pair of rail assemblies 39 (one being shown) on confronting inner surfaces of left and right columnar portions of the frame 30B adjacent to bottom ends thereof so that the horizontal table 30A is reciprocally movable relative to the frame 30B in the left and right directions on FIG. 3. The horizontal table 30A includes a pair of roll supports 42 (one being shown) disposed on an upper surface of the horizontal table 30A for supporting thereon a new or succeeding film supply roll 40, a core tube recovery portion or unit 44 attached to a leading end of the horizontal table 30A, and second and third suction units or devices 46 and 48 disposed on the upper surface of the horizontal table 30A. The horizontal table 30A is reciprocally moved by the air cylinder 34 in the horizontal direction on FIGS. 1 and 3. The air cylinder 34 and the horizontal table 30A are slidably engaged together by an engagement piece 50 which is horizontal and parallel to the rails 38, so as to accommodate sliding movement of the horizontal table 30A along the rails 38.

The roll supports 42 are provided to support thereon the succeeding film supply roll 40 horizontally in parallel relation to the film supply roll (hereinafter referred to as preceding film supply roll) 14 rotatably supported at a set position by a pair of confronting spindles 52 (see FIG. 4). The roll supports 42 are each provided with an air cylinder 42A for adjusting the vertical level or height of the succeeding film supply roll 40.

The horizontal position of the roll supports 42 is determined such that when the horizontal table 30A is forced leftwards in FIGS. 1 and 3 by the air cylinder 34 until it arrives at its a forward stroke end, a longitudinal axis of the succeeding film supply roll 40 is aligned with a common axis of the opposed spindles 52.

The spindles 52 are composed of a pair of left and right spindles and, as shown in FIG. 4, each spindle 52 is rotatably supported by a pair of bearings 52B and movable back and forth in the axial direction thereof. When advanced, the spindles 52 come into engagement with opposite ends of the core tube 14A of the film supply roll to thereby rotatably support the core tube 14A.

A rotating light-blocking plate 53A is attached to the rear end of the left spindle 52 shown in FIG. 4. The rotating light-blocking plate 53A is detected by a photosensor 53B to determine as to whether the left spindle 52 is rotating or not. The right spindle (not shown) is coupled to a torque motor (not shown) for performing a brake action of the same spindle.

The first suction device 24 is disposed between a pair of vertically spaced guide rolls 54A and 54B provided to guide the film 12 vertically after the film 12 is unwound from the preceding film supply roll 14 held in the set position. The first suction device 24 has a vertical suction surface 24A extending parallel to, and located close to, a film running plane in which a portion of the film 12 running between the two guide rolls 54A, 54B extends. The suction surface 24A is provided with a number of suction holes 24B to which a negative pressure is applied.

The second suction device 46 is attached by a cylinder unit or device 47 to respective upper ends of a pair of vertical support posts 30C extending from left and right ends of the horizontal table 30A, the support posts 30C being normally disposed close to the frame 30B. The second suction device 46 has a suction surface 46A disposed at the same level or height as the suction surface 24A of the first suction device 24 and extending in parallel confrontation to the suction surface 24A. The suction surface 46A is provided with a number of suction holes 46B to which a negative pressure is applied.

The third suction device 48 is mounted on a pair of opposed horizontal support bars 30D extending inwardly from the support posts 30C, respectively, at a position below the suction surface 46A of the second suction device 46. The third suction device 48 has a suction surface 48A vertically extending in flush with the suction surface 46A of the second suction device 46. The suction surface 48A is provided with a number of suction holes 48B to which a negative pressure is applied.

The frame 30B is provided with a leading end cutter 60 disposed in confrontation with the suction surface 46A of the second suction device 46 for cutting or severing the film horizontally in the widthwise direction at the center of the height of the suction surface 46A while the film is held by suction on the suction surface 46A.

The leading end cutter 60 is composed of a disk cutter horizontally and rotatably supported within a housing 60A. The housing 60A is slidably mounted on a horizontal guide bar 60B extending between the left and right columnar portions of the frame 30B in parallel relation to the suction surface 46A. The housing 60A is manually reciprocated along the guide bar 60B via an operation knob 60C during which time the film while being held by suction on the suction surface 46A is cut or severed by the leading end cutter 60.

Similarly, a trailing end cutter 62 is disposed in confrontation with the suction surface 24A of the first suction device 24 for cutting or severing the film horizontally in the widthwise direction at the center of the height of the suction surface 24A while the film is held by suction on the suction surface 24A. The trailing end cutter 62 is composed of a disk cutter horizontally and rotatably supported within a housing 62A. The housing 62A is threaded over a horizontal feed screw 62C coupled in driven relation to an electric motor (not shown). When the feed screw 62C is rotated in forward and reverse directions by the electric motor, the housing 62C is reciprocated in the widthwise direction of the film 12 along the suction surface 24A with the result that the film 12 while being held by suction on the suction surface 24A is cut or severed by the trailing end cutter 62.

The core tube recovery unit 44 is attached to each of two laterally spaced portions of the leading end of the horizontal table 30A remote from the rails 38 and has a bucket shape in vertical cross section with its upper end open at a position below the horizontal table 30A. The bucket-shaped core rude recovery units 44 each have a front side formed by a sloped surface 44A extending upwardly and outwardly, and a slide ball 44B attached to a lower portion of the sloped surface 44A.

The guide plates 32 is generally L-shaped in cross section and has one end pivotally supported by a horizontal oscillating shaft 33 extending parallel to the axis of the preceding film supply roll 14 at a position above the preceding film supply roll 14 held at the set position. The L-shaped guide plate 32 thus supported is pivotally movable in a vertical plane about an axis of the oscillating shaft 33.

The guide plate 32 is oscillated about the oscillating shaft 33 by means of a drive unit or device 64. In the normal condition, the guide plate 32 is disposed in a retracted position in which as illustrated by the solid lines in FIG. 3, two arms of the guide plate 32, respectively, extend horizontally and vertically and are held out of contact with the preceding film supply roll 14. When the guide plate 32 is turned counterclockwise through an angle of about 30 degrees to move from the retracted position to a guiding position, as illustrated by the two-dot chain lines, the guide plate 32 forms or provides a sloped guide surface 32B substantially contiguous to the sloped surface 44A of the core tube recovery unit 44. In this instance, the sloped guide surface 32B is substantially held in contact with the outer peripheral surface of the core tube 14A of the film supply roll 14 at opposite ends thereof.

Reference numeral 66 shown in FIG. 3 denotes upper and lower horizontal rails 66 for enabling the spindles 52 to move in the axial direction of the film supply roll 14 for adjustment of adjusting the position of the film supply roll 14. Designated by 67 shown in FIG. 5 is a rotary encoder for detecting the amount of film unwound from the film supply roll.

Figure 5:
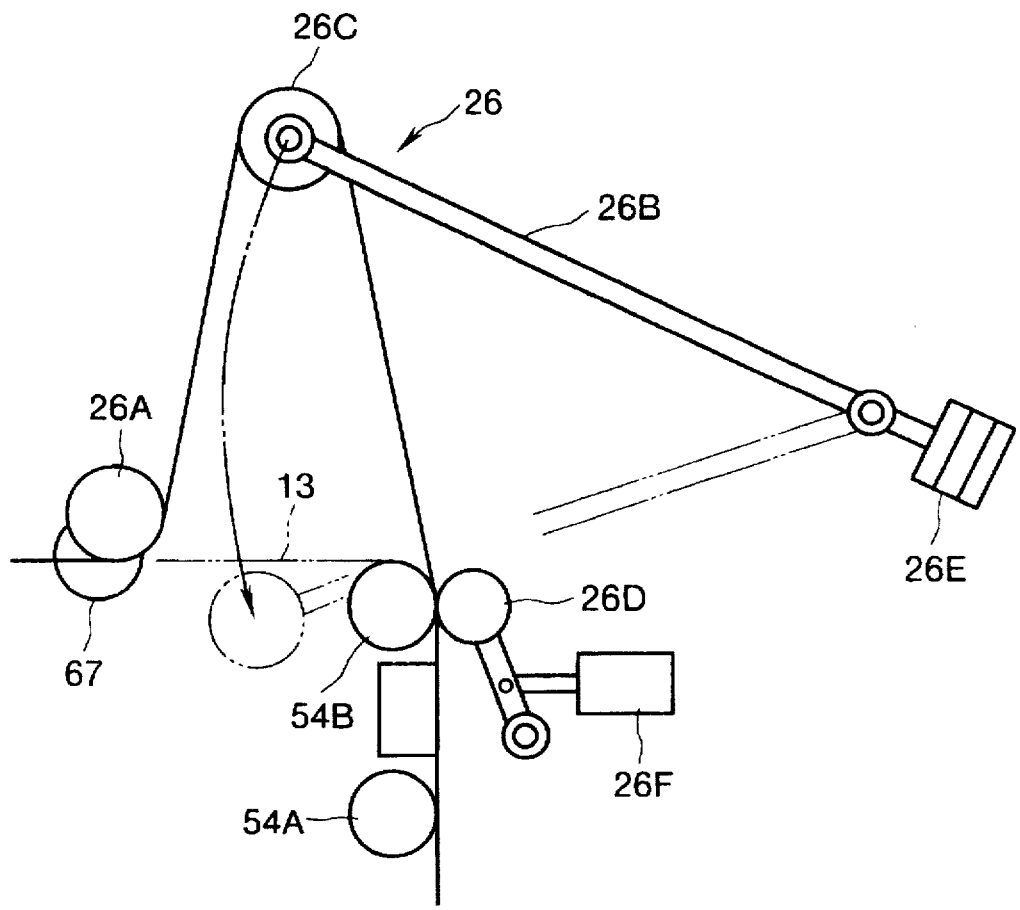
FIG. 5 is a diagrammatic side view showing on enlarged scale an accumulator of the continuous film-supplying apparatus.

The accumulator 26, as shown in FIG. 5, is composed of a fixed or stationary roll 26A disposed downstream of the guide roll 54B, a tension roll 26C disposed between the guide roll 54B and the stationary roll 26A and vertically movable by a lever 26B, a pinch roll 26D urged into contact with the guide roll 54B to hold or grip the film therebetween, and an actuator 26F for actuating the pinch roll 26D to touch position or detached position with the guide roll 54B. The tension roll 26C is upwardly displaceable by a lever 26B to lift up a portion of the film 12 from a film path 13 to thereby store or accumulate a predetermined length of the film between the stationary roll 26A and the pinch roll 26D. The lever 26B is urged in the clockwise direction by a counterweight 26E.

The cover-film separating devices 28 are disposed in tandem below the film path 13 in confronting relation to the cover film 12C of the continuous film 12. The cover-film separating devices 28 are constructed such that in either device, the adhesive surface of an adhesive tape 28A is forced upwardly by a roll 28B against the cover film 12C to peel off of separate the cover film 12C and then take up the separated cover film 12 around a cover film separating device 28 together with the adhesive tape 28A.

The pair of cover-film separating devices 28, 28 can be withdrawn from, and inserted into, the housing 10A of the film applying apparatus 10 in the lateral direction of the film path. With this arrangement, even when the film applying apparatus 10 is in motion, it is possible to first pull out the cover-film separating device 28 from the housing 10A when the adhesive-tape 28A is fully taken up, then attach a new adhesive tape 28A and a new take-up roll 28C, and finally set the device 20 again into the housing 10A.

In FIG. 1 reference numeral 68 denotes a preheater disposed in a combined overturning and heating unit 69 for heating the base plate 18 from the below at an optimum temperature for application of the film 12 to the base plate 18 while the base plate 18 is being fed along a conveyance path or line 19, with a film applying surface 18A facing downwards. The combined overturning and heating unit 69 is disposed at the entry side of the film applying apparatus 10 and includes an overturning device (not shown) for turning over or inverting the base plate 18 before it is fed along the conveyance line 19. Designated by 19A in FIG. 1 are series of conveying rolls for conveying the base plate 18 rightwards after the film 12 is applied by the lamination rolls 20 to the base plate 18.

The rotary cutter 22 is composed of a rotary knife 22A and a stationary knife 22B and cuts or severs the film 12 transversely (i.e., in the widthwise direction) at a position between two adjacent ones of the base plates 18. The rotary knife 22A is disposed on an upper side of the conveyance line 19 of the base plates 18 while the stationary knife 22B on the lower side of the conveyance line 19. The rotary knife 22A is rotatably driven in the counter-clockwise direction in FIG. 1 to prevent the film 12 from becoming distorted upwardly during cutting operation. The rotary knife 22A would otherwise jerk up the base plate 18 via the upward distortion of the film 12, tending to damage the base plate 18 particularly when the base plate 18 is composed of a thin glass plate, for example.

In FIG. 1 numeral 70 denotes a combined overturning and discharging unit disposed at the discharge side of the film applying apparatus 10. In the combined overturning and discharging unit 70, the base plate 18 which has been conveyed by the conveying rolls 19A with the film 12 applied thereto is turned about a pivot shaft 71A through an angle of 180 degrees by an overturning device 71 and transferred from the overturning device 71 to a discharging device 72 with the film 12 facing upwards, and after that the base plate 18 is discharged from the apparatus by the discharging device 72.

The film applying apparatus 10 has a plurality of pairs of vertically spaced upper and lower wheels 80 arranged to hold or embrace a pair of parallel spaced base side rails 78 from above and below, so that the film applying apparatus 10 can be moved relative to the combined overturning and heating unit 69 on the entry side and the combined overturning and discharging unit 70 on the discharged side in the lateral direction of the conveyance line 19. The film applying apparatus 10 can be withdrawn along the base side rails 78 in the downward direction in FIG. 2 and in a direction perpendicular to the sheet of FIG. 1.

The housing 10A of the film applying apparatus 10 which is withdrawable along the base side rails 78 contains the lamination rolls 20, the rotary cutter 22, the continuous film-supplying apparatus 23 and the pair of cover-film separating devices 28.

As described above, the continuous film-supplying apparatus 23 and the pair of cover-film separating devices 28 can be withdrawn in the lateral direction independently from one another.

The operation of the entire apparatus in the foregoing embodiment will be described below.

Figure 7:
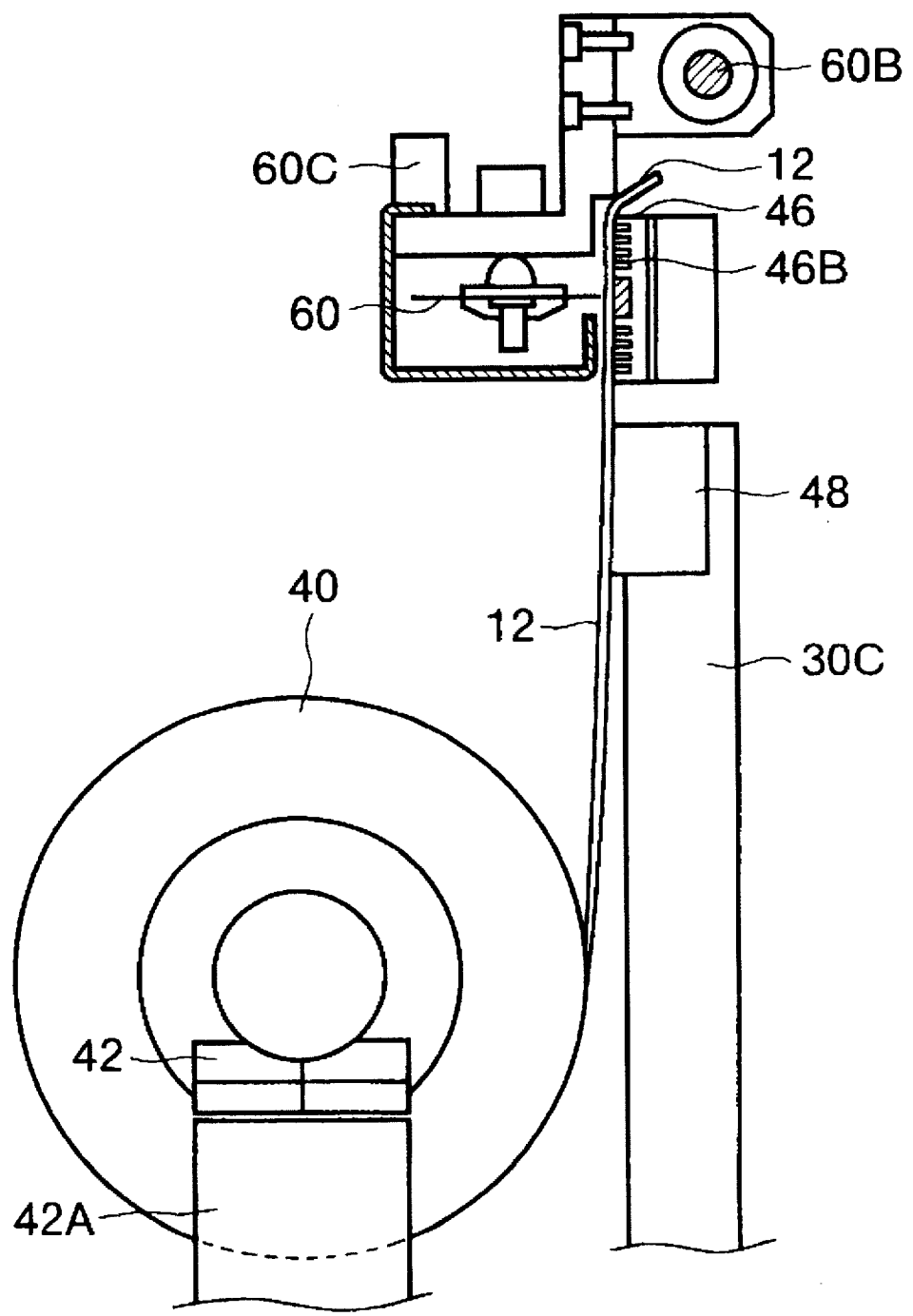
FIG. 7 is a schematic cross-sectional view illustrative of the manner in which a leading end of the succeeding film is formed in the continuous film-supplying apparatus.

While the film applying apparatus 10 is in motion, the replacing roll carriage 30 of the continuous film-supplying apparatus 23 is withdrawn along the rails 38 to a position laterally offset from the conveyance line 19. At this position, the succeeding film supply roll 40 is placed on the roll supports 42, and a film 12 is withdrawn from the succeeding film supply roll 40 and then a leading end portion of the film 12 is held by suction on the respective suction surfaces 46A and 48A of the second and third suction devices 46 and 48 (see FIG. 7).

Figure 8:
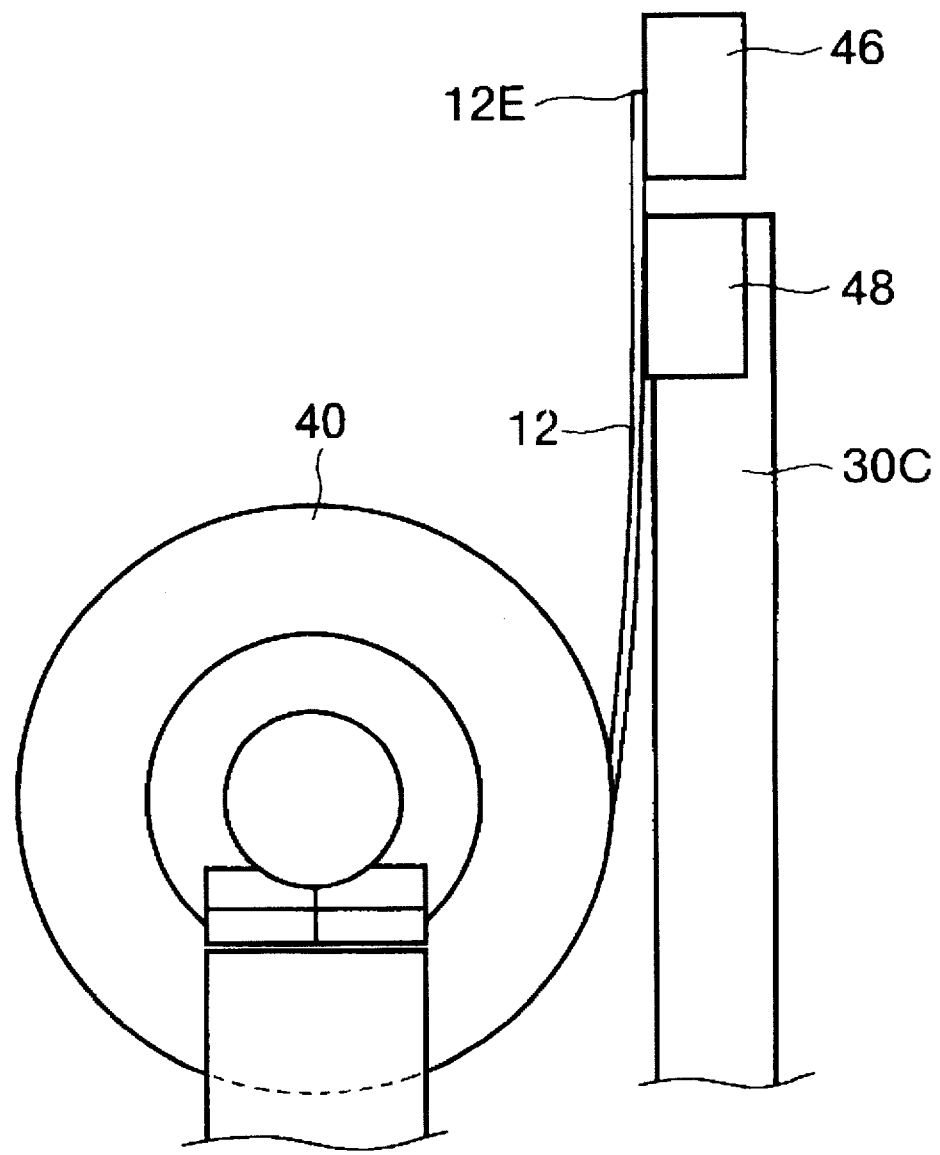
FIG. 8 is a schematic cross-sectional view showing the leading end of the succeeding film.

Thereafter, as shown in FIG. 8, the leading end cutter 60 is manually operated to cut or sever the leading end portion of the film 12 transversely across the width of the film 12 at the center of the height of the suction surface 46A to form a leading end 12E while the leading film end portion is held by suction on the suction surface 46A.

Figure 9:
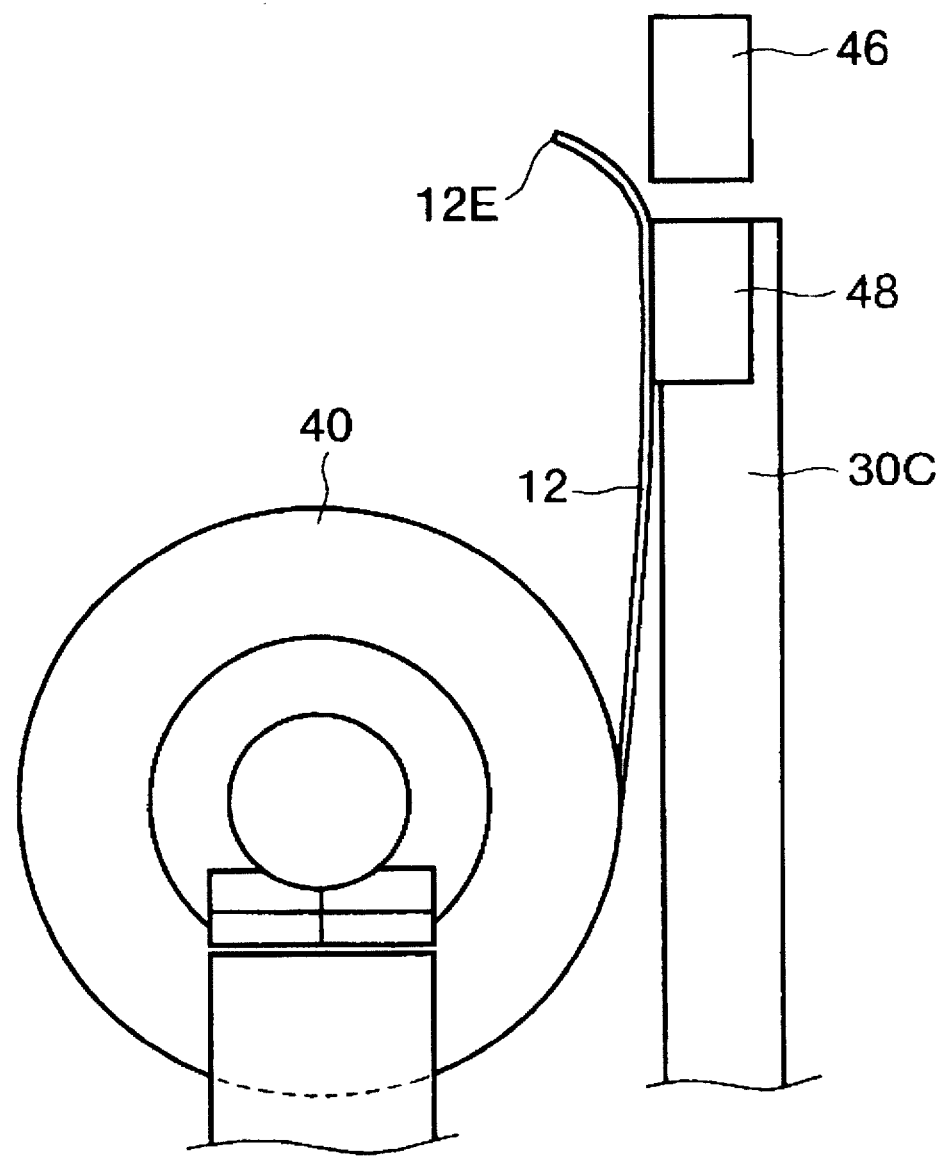
FIG. 9 is a schematic cross-sectional view showing the condition in which the leading end of the succeeding film is separated.

Then, as shown in FIG. 9, while the film 12 is held by suction on the suction surface 48A of the third suction device 48, the leading end 12E of the film 12 is pulled to separate the same from the suction surface 46A of the second suction device 46.

Figure 10:
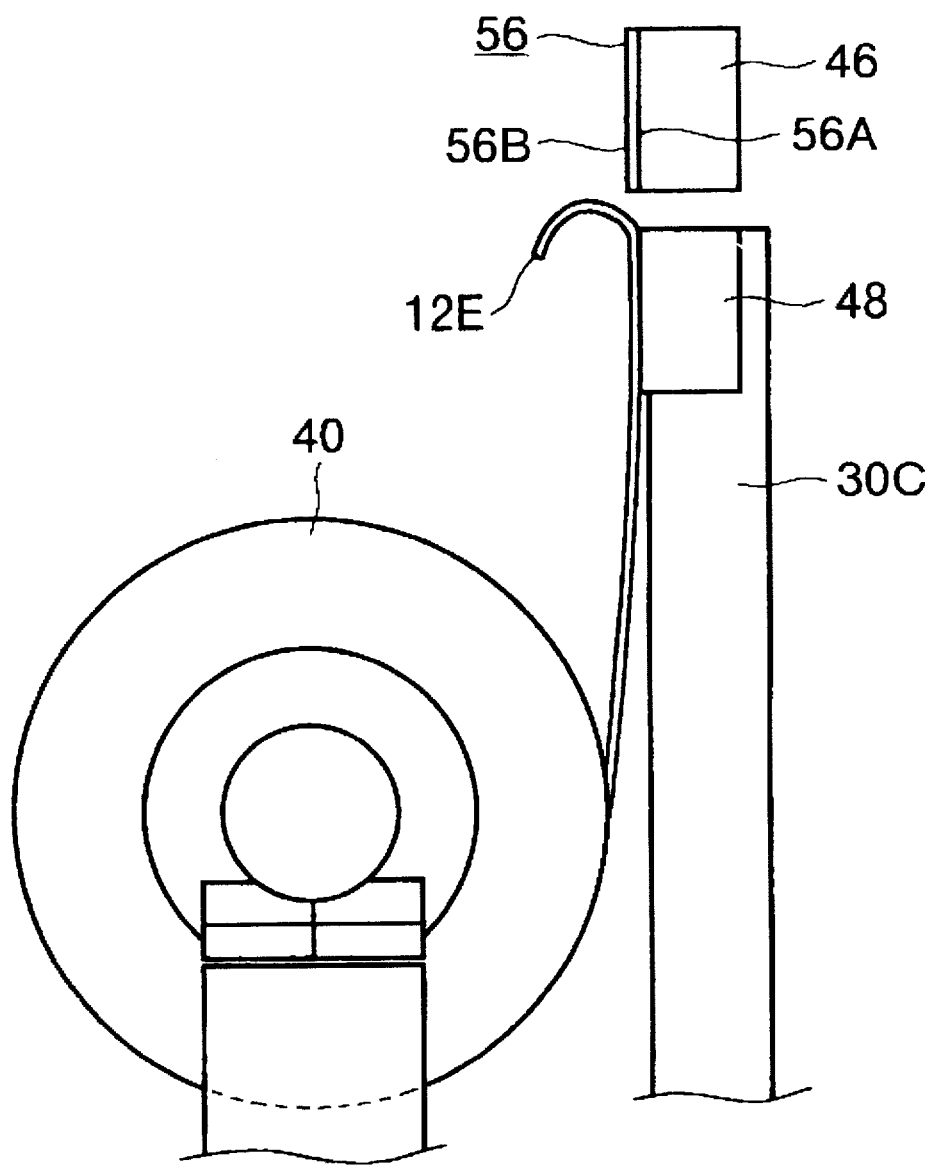
FIG. 10 is a schematic cross-sectional view showing an adhesive single coated tape held by suction on a second suction surface.

Subsequently, as shown in FIG. 10, an adhesive single coated tape 56 is withdrawn from an adhesive tape supply roll (not shown), and after a non-adhesive side 56A of the adhesive single coated tape 56 is held by suction on the suction surface 46A of the second suction device 46, the adhesive single coated tape 56 is cut or severed into a length equal to the width of the film 12.

Figure 11:
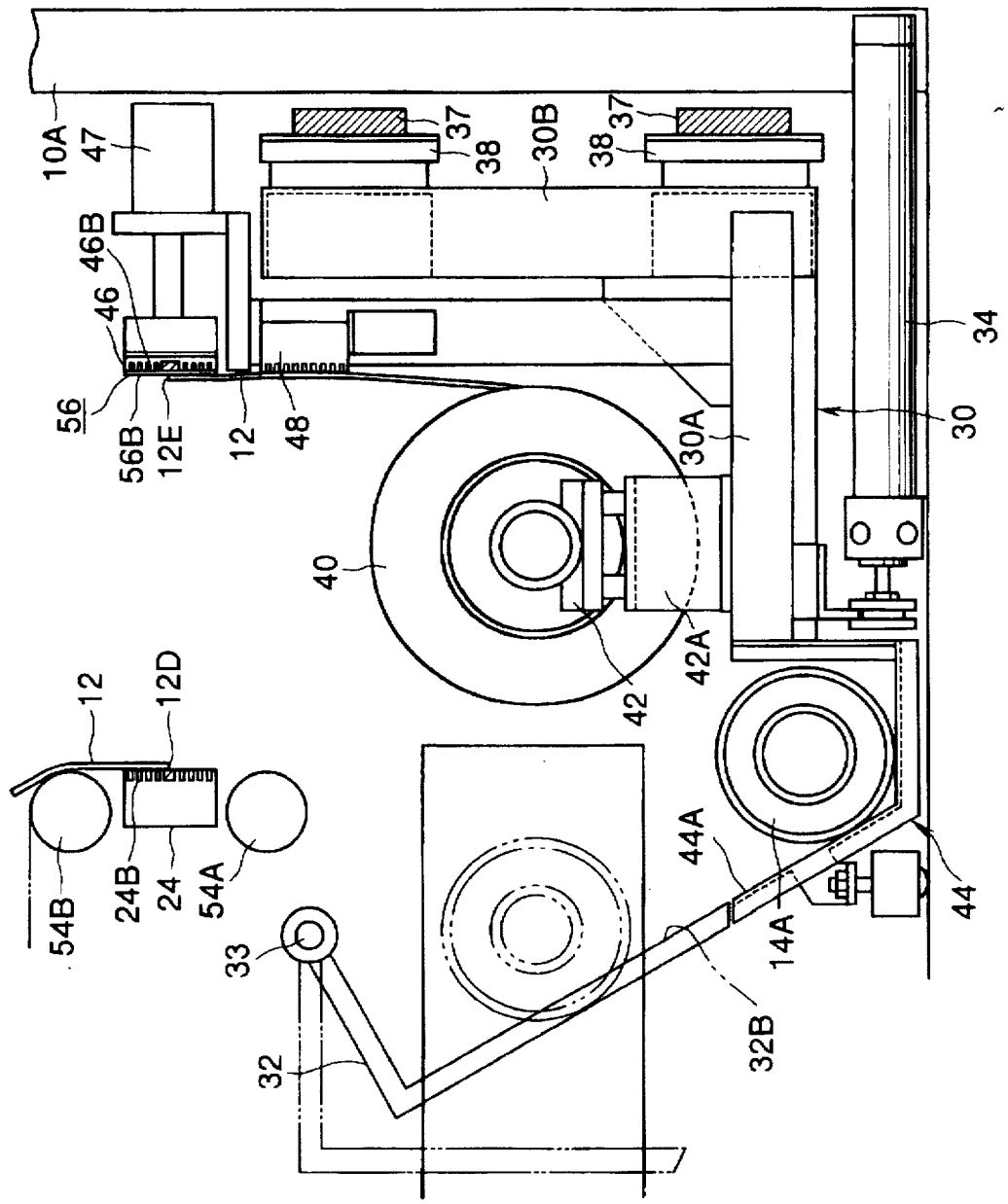
FIG. 11 is a schematic cross-sectional view showing the condition immediately before two films are joined end to end in the continuous film-supplying apparatus.

Thereafter, as shown in FIG 11, the leading end 12E of the film 12 which has been separated from the suction surface 46A is bonded to an adhesive surface 56B of the adhesive single coated tape 56 while being held by suction on the suction surface 46A. The leading end 12E thus bonded to the adhesive surface 56B of the adhesive single coated tape 56 is held at the center of the height of the suction surface 46A.

If a core tube already recovered in the core tube recovery unit 44 is found when the replacing roll carriage 30 is pulled out, the core tube is taken out, and after that the replacing roll carriage 30 is forced to move along the rails 30 back into the housing 10A to thereby set the replacing roll carriage 30 in the condition shown in FIG. 11.

When the rotary encoder 67 detects the condition that the amount of film unwound from the preceding film supply roll 14 exceeds a predetermined value, the rotary encoder 67 generates an output signal according to which the lever 26B of the accumulator 27 is driven or turned in the clockwise direction in FIG. 5 (by releasing the counterweight 26E) to move the tension roll 26C upwardly to unwind a predetermined length of the film 12. Then, the pinch roll 26D is forced toward the guide roll 54B to firmly grip the film 12 therebetween.

Figure 12:
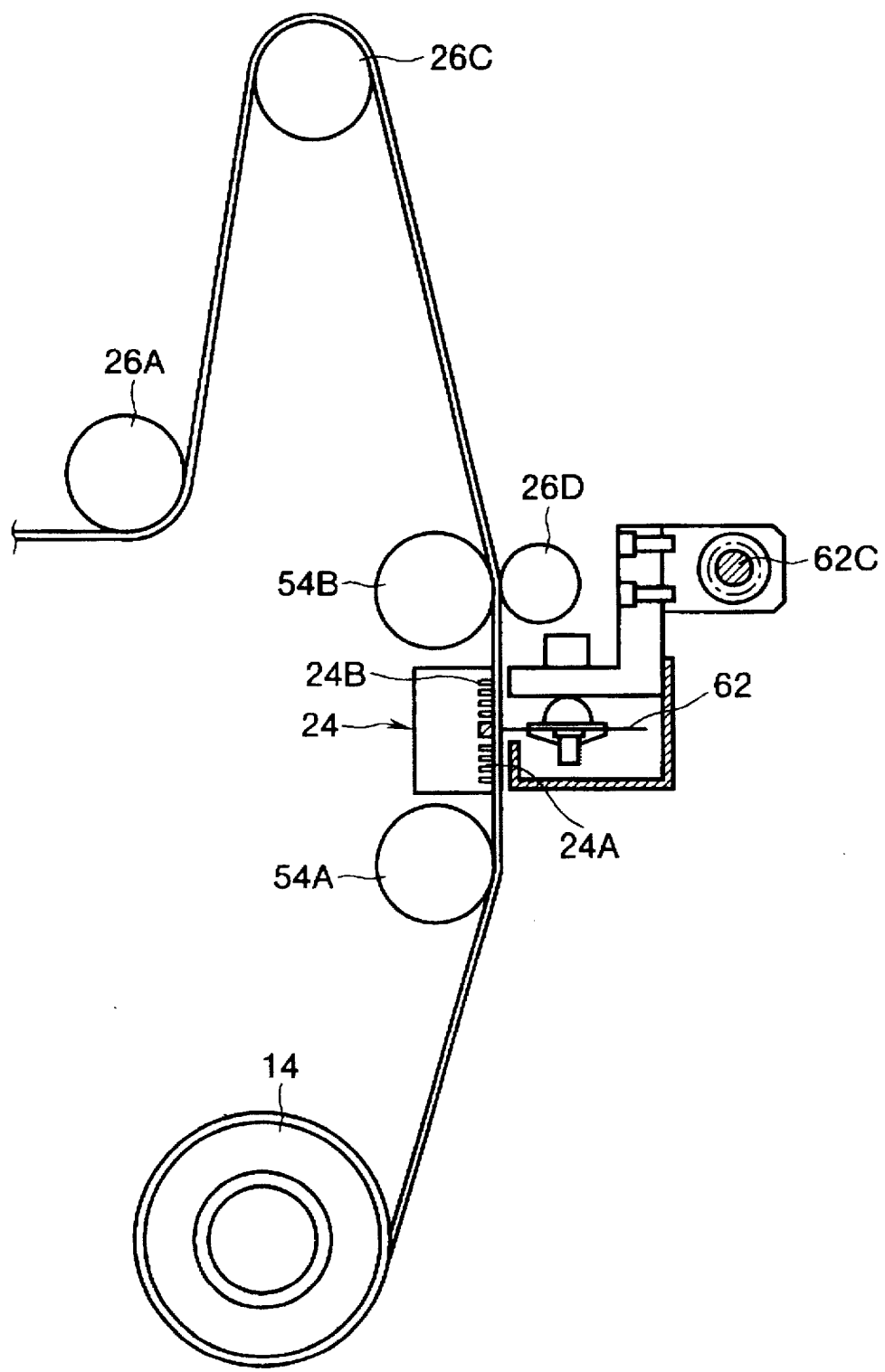
FIG. 12 is a schematic cross-sectional view illustrative of the manner in which a trailing end of the preceding film is formed in the continuous film-supplying apparatus.
Figure 13:
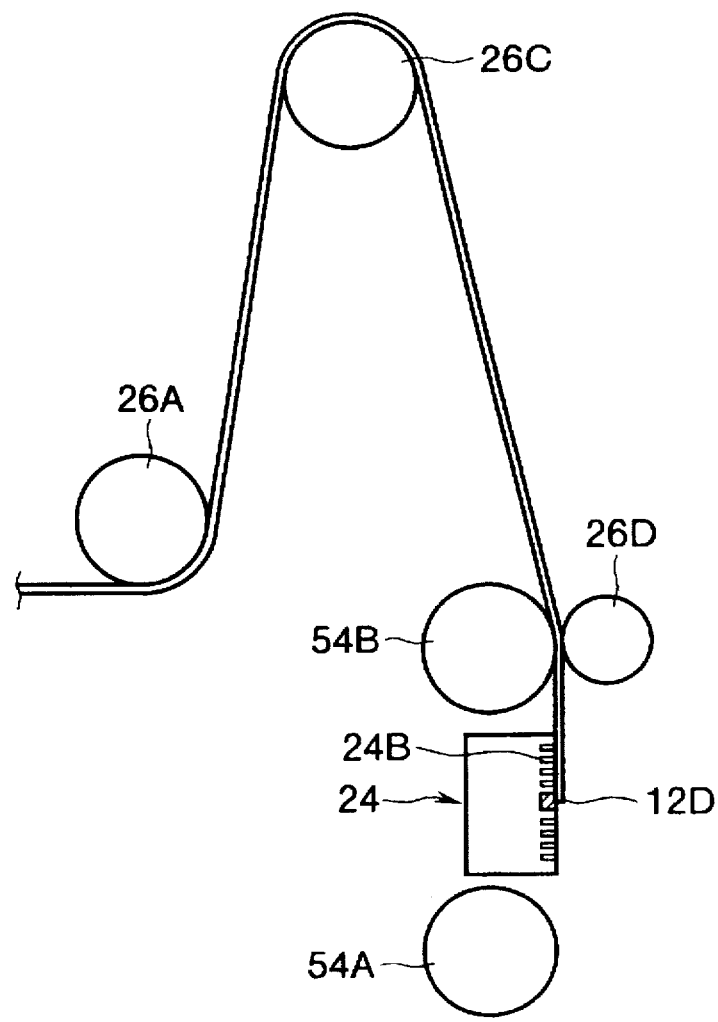
FIG. 13 is a schematic cross-sectional view showing the condition after the trailing end of the preceding film is formed in the continuous film-supplying apparatus.
Figure 13:
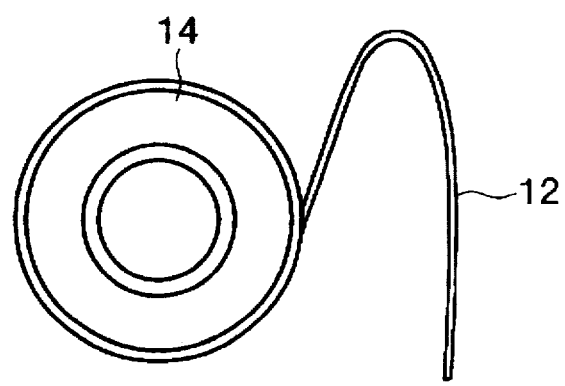

While keeping this condition, the film 12 is held by suction on the first suction device 24, and then the trailing end cutter 62 is driven, as shown in FIG. 12, to form a trailing end 12D of the film 12, such as shown in FIG. 13.

Subsequently, as shown in FIG. 11, the guide plate 32 is driven or turned counterclockwise through an angle of about 30 degrees to the solid-lined guiding position in which the sloped guide surface 32B is substantially contiguous to the sloped surface 44A of the core tube recovery unit 44, and then the spindles 52 are retracted from the preceding film supply roll 14 to release the core tube 14A and a small amount of film 12 left on the core tube 14A. The core tube 14A rolls downwards along the sloped guide surface 32B and the sloped surface 44A and is finally recovered in the core tube recovery unit 44.

In this instance, a leading end of the film 12 rolled on the film supply roll 14, which is formed as a result of cutting by the trailing end cutter 62 at the first suction device 24, is forcibly separated from the first suction device 24 as the core tube 14A drops into the core tube recovery unit 44.

Figure 14:
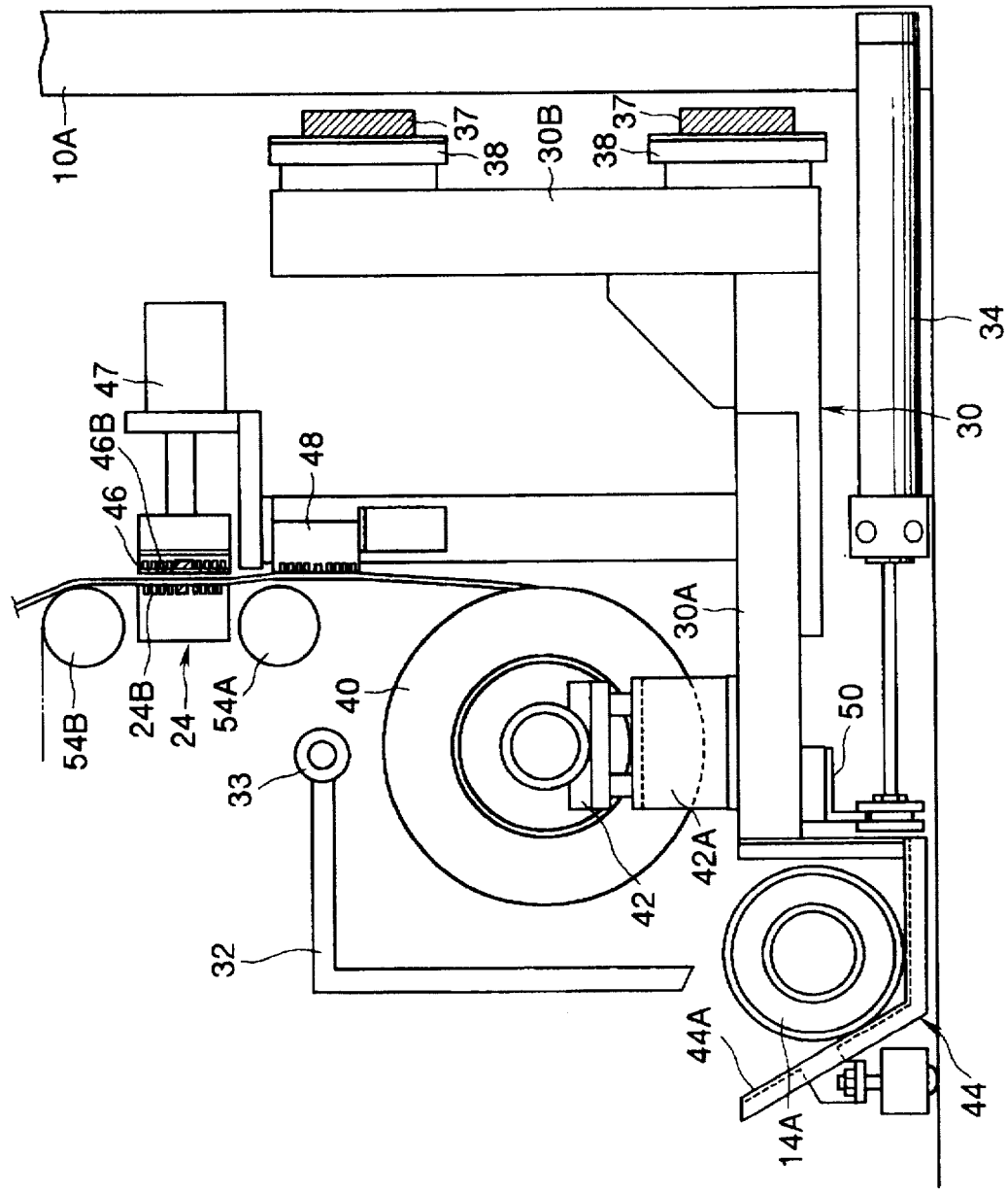
FIG. 14 is a schematic cross-sectional view illustrative of the condition in which the trailing end of the preceding film and the leading end of the succeeding film are joined together end to end in the continuous film-supplying apparatus.

Then, the guide plate 32 is returned to the phantom-lined position of FIG. 3, and thereafter the air cylinder 34 is driven to move the horizontal table 30A in the left-hand direction of FIG. 14 so that the central axis of the succeeding film supply roll 40 assumes the position of the central axis of a film supply roll set at the set position.

In this instance, an upper half of the adhesive surface 36B of the adhesive single coated tape 56 while being held by suction on the second suction device 46 is forced by the second suction device 46 against the light-transmissible support film 12A of the preceding film 12 adjacent the trailing end 12D of the same film 12 while being held by suction on the first suction device 24. Then, the cylinder device 47 is driven to move the second suction device 46 toward the first suction device 24 to thereby enhance the bonding strength between the adhesive single coated tape 56 and the trailing end portion of the preceding film 12 and the leading end portion of the succeeding film 12.

The trailing end 12D of the preceding film 12 and the leading end 12E of the succeeding film 12 are joined together end to end or continuously in the longitudinal direction of the tapes 12 by adhesive bonding between the light-transmissible support film 12A and the adhesive surface 56B of the adhesive single coated tape 56.

During this bonding process, the film 12 (preceding film) is fed to the lamination rolls 20 and applied by these lamination rolls 20 to the film applying surfaces 18A of the respective base plates 18 while being conveyed intermittently. The film used for application to the base plates 18 is supplied by drawing it from the accumulator 26 during which time the tension roll 20C of the accumulator is lowered 26.

While the trailing end 12D of the film 12 and the leading end 12E of the film 12 are joined end to end by the adhesive single coated tape 56, the succeeding film supply roll 40 already placed at the set position is rotatably supported by the spindles 52.

Then, the roll supports 42 are lowered by the air cylinders 42A, and the horizontal table 30A is returned by the air cylinder 34 to the position shown in FIG. 11. Thereafter, the replacing roll carriage 30 is pulled out again in the lateral direction, the recovered core tube 14A is removed, and a new film supply roll is placed on the roll supports 42. Subsequently, the tape 12 drawn out from the new film supply roll is bonded at its leading end 12E to the adhesive surface 56B of a new adhesive single coated tape 56 now held by suction on the suction surface 46A of the second suction device 46 in the same manner as described above, and while keeping this condition, the replacing roll carriage 30 is forced back into the housing 10A to assume a posture of standing by until the next film-supply-roll replacing operation.

Figure 15:
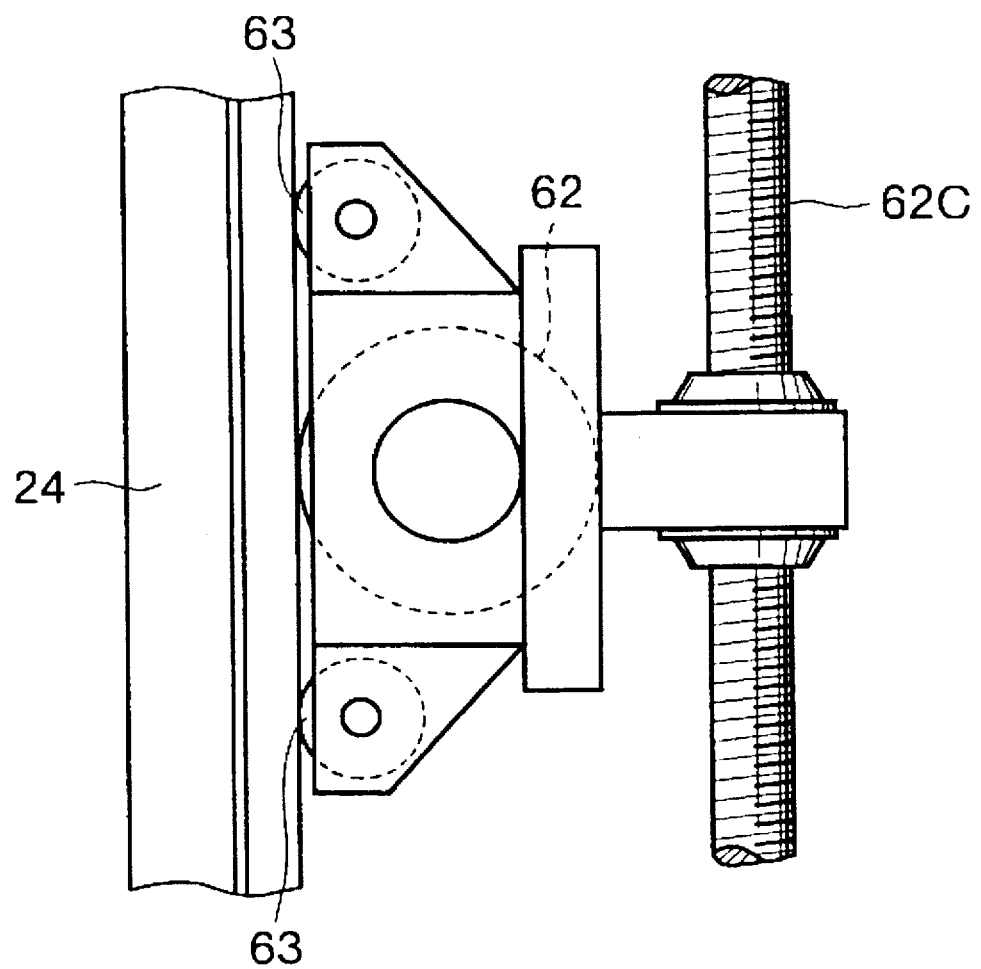
FIG. 15 is a cross-sectional view showing another embodiment of a pressure means incorporated in the continuous film-supplying apparatus for forcing the adhesive single coated tape.

In the embodiment described above, the adhesive surface 56B of the adhesive single coated tape 56 is forced against the trailing end 12D of the preceding film by the second suction device 46. The present invention should by no means be limited to the illustrated embodiment but includes a modification in which as shown in FIG. 15 a pressure member composed of a plurality of pressure rollers 63, for example, is associated with the trailing end cutter 62 movable in the widthwise direction of the tape 12. The trailing end 12D of the preceding film 12 and the leading end 12E of the succeeding film 12 while being held on the second suction device 24 in a such a condition as to form a butt joint via the adhesive single coated tape 56 are forced against the suction surface 24A of the first suction device 24 by means of the pressure member (pressure rollers) 63, and as the pressure member 63 is moved transversely together with the trailing end cutter 62, the trailing end 12D and the leading end 12E are firmly bonded to the adhesive single coated tape 56. During that time, the trailing end cutter 62 is retracted away from its operating or cutting position.

Furthermore, in the embodiment described above, the film 12 with the cover film 12C removed previously is applied continuously to the base plates 18 while they are conveyed intermittently. The present invention is not limited to the illustrated embodiment but can be also applied to a film applying apparatus of the type wherein the film is cut into individual lengths which are in turn applied to individual base plates by means of a tacking member, another film applying apparatus in which after the cover film is separated, the film is applied to one base plate at a time while cutting the film is cut into an individual length, and any other apparatus in which the film is supplied continuously.

Although the photosensitive resin layer 12B shown in the illustrated embodiment is laminated on the light-transmissible support film 12A, the support film 12A should by no means be light-transmissible but may be transmissible to electron ray, X-ray, ultraviolet ray or the like, or opaque.

What is claimed is:

1. A method of continuously supplying a continuous film from a film supply roll in a film applying apparatus, of the type wherein a continuous film composed of a support film, a photosensitive resin layer and a cover film laminated one above another is withdrawn from the film supply roll, and after the cover film is separated, the continuous film is pressured-bonded by lamination rolls to a base plate while being conveyed by a conveying means, with the photosensitive resin layer situated on a film applying surface of the base plate, wherein a trailing end of a preceding continuous film unwound from the film supply roll is held at its cover film side by suction on a first suction means at a fixed position, then a leading end of a succeeding continuous film unwound from a succeeding film supply roll is bonded at its support film side to a portion of an adhesive surface of an adhesive single coated sheet while being held at its non-adhesive side by suction on a second suction means, and thereafter the remaining portion of the adhesive surface of the adhesive single coated sheet is forced against the support film side of the trailing end of the preceding continuous film to thereby bond the trailing end to the adhesive single coated sheet, wherein a leading end portion of the succeeding continuous film while being held by suction on the second suction means is severed transversely at the center of the second suction means in the film feed direction to form said leading end, then the succeeding continuous film is held by suction on a third suction means at a position adjacent to that side of said second suction means which is located closer to the axis of the succeeding film supply roll, and while keeping this condition, the leading end portion of the succeeding continuous film is separated from the second suction means and the non-adhesive side of the adhesive single coated sheet is held by suction on the second suction means, and thereafter the separated leading end portion of the succeeding continuous film is bonded to the adhesive surface of the adhesive single coated sheet on a suction surface of the second suction means.

2. A method according to claim 1, wherein the preceding continuous film while being held by suction on the first suction means is severed transversely at a position of the first suction means to form a trailing end.

3. A method according to claim 1, wherein the adhesive single coated sheet is forced by the second suction means against the trailing end of the preceding continuous film while being held by suction on the first suction means.

4. A method of continuously supplying a continuous film from a film supply roll in a film applying apparatus, of the type wherein a continuous film composed of a support film, a photosensitive resin layer and a cover film laminated one above another is withdrawn from the film supply roll, and after the cover film is separated, the continuous film is pressured-bonded by lamination rolls to a base plate while being conveyed by a conveying means, with the photosensitive resin layer situated on a film applying surface of the base plate, wherein a trailing end of a preceding continuous film unwound from the film supply roll is held at its cover film side by suction on a first suction means at a fixed position, then a leading end of a succeeding continuous film unwound from a succeeding film supply roll is bonded at its support film side to a portion of an adhesive surface of an adhesive single coated sheet while being held at its nonadhesive side by suction on a second suction means, and thereafter the remaining portion of the adhesive surface of the adhesive single coated sheet is forced against the support film side of the trailing end of the preceding continuous film to thereby bond the trailing end to the adhesive single coated sheet, wherein the second suction means and the succeeding film supply roll are displaced in synchronism with each other, and when the succeeding film supply roll arrives at a set position, said remaining portion of the adhesive surface of the adhesive single coated sheet is forced against the trailing end of the preceding continuous film while being held by suction on the first suction means.

5. An apparatus for continuously supplying a continuous film from a film supply roll in a film applying apparatus, of the type wherein a continuous film composed of a support film, a photosensitive resin layer and a cover film laminated one above another is withdrawn from the film supply roll, and after the cover film is separated, the continuous film is pressure-bonded by lamination rolls to a base plate while being conveyed by a conveying means, with the photosensitive resin layer situated on a film applying surface of the base plate, further comprising first suction means for holding by suction, at a fixed position, the cover film side of a trailing end of a preceding continuous film unwound from a preceding film supply roll held at a set position, second suction means having the same width as said first suction means and capable of holding by suction a non-adhesive side of an adhesive single coated sheet, transfer means for feeding said second suction means to the position of said first suction means while a leading end of a succeeding continuous film unwound from a succeeding film supply roll is being bonded at its support film side to a longitudinal portion of an adhesive surface of an adhesive single coated sheet being held by suction on said second suction means, thereby pressure-bonding the remaining portion of said adhesive surface of said adhesive single coated sheet and the support film side of the trailing end of the preceding continuous film being held by suction on said first suction means, and a leading end cutter disposed in confrontation to a film suction surface of said second suction means for severing a leading end portion of the succeeding continuous film transversely at a center of said film suction surface in the film feed direction while the leading end portion is held by suction on said film suction surface.

6. An apparatus according to claim 5, wherein said transfer means includes a carriage movable in a direction parallel to the axis of rotation of said film supply roll.

7. An apparatus according to claim 5, wherein said transfer means is capable of holding said succeeding film supply roll in parallel relation to said preceding film supply roll while in said set position and transferring said succeeding film supply roll to said set position, and said second suction means, when arrived at said set position, comes into pressure contact with said first suction means via said adhesive single coated sheet and the preceding and succeeding continuous films.

8. An apparatus according to claim 7, further including a cylinder device for supporting said second suction means such that said second suction means is reciprocally movable toward and away from said first suction means.

9. An apparatus according to claim 5, further including a trailing end cutter disposed in confrontation to a film suction surface of said first suction means at a center of said film suction surface and movable in a widthwise direction of the continuous film for severing the preceding continuous film transversely while the preceding continuous film is held by suction on said film suction surface.

10. An apparatus according to claim 9, wherein said trailing end cutter is provided with a movable pressure member movable in the widthwise direction of the film while forcing the trailing end of the preceding continuous film and the leading end of the succeeding continuous film in the direction of the thickness while said trailing and leading ends are being held by suction on said first suction means in such a manner as to form a butt joint via said adhesive single coated sheet.

11. An apparatus according to claim 5, wherein said transfer means includes a core tube recovery unit disposed below and adjacent to the preceding film supply roll while being set, for receiving the preceding film supply roll when it is released for downward movement when an amount of film left on the preceding film supply roll falls below a predetermined value.

12. An apparatus according to claim 11, further including a guide plate disposed adjacent to the preceding film supply roll while being set and pivotally movable within a fixed angular range between an inclined position in which said guide plate forms a sloped guide surface for guiding therealong the preceding film supply roll in a downward direction toward said core tube recovery unit, and a retracted position in which said guide plate is held out of contact with said preceding film supply roll.

13. An apparatus for continuously supplying a continuous film from a film supply roll in a film applying apparatus, of the type wherein a continuous film composed of a support film, a photosensitive resin layer and a cover film laminated one above another is withdrawn from the film supply roll, and after the cover film is separated, the continuous film is pressure-bonded by lamination rolls to a base plate while being conveyed by a conveying means, with the photosensitive resin layer situated on a film applying surface of the base plate, further comprising first suction means for holding by suction, at a fixed position, the cover film side of a trailing end of a preceding continuous film unwound from a preceding film supply roll held at a set position, second suction means having the same width as said first suction means and capable of holding by suction a non-adhesive side of an adhesive single coated sheet, and transfer means for feeding said second suction means to the position of said first suction means while a leading end of a succeeding continuous film unwound from a succeeding film supply roll is being bonded at its support film side to a longitudinal portion of an adhesive surface of an adhesive single coated sheet being held by suction on said second suction means, thereby pressure-bonding the remaining portion of said adhesive surface of said adhesive single coated sheet and the support film side of the trailing end of the preceding continuous film being held by suction on said first suction means, wherein said transfer means is provided with third suction means disposed adjacent to that side of said second suction means located closer to the axis of said succeeding film supply roll for holding by suction a portion of said succeeding continuous film located adjacent to that part of the leading end portion of the succeeding continuous film which is located closer to the axis of the succeeding film supply roll and adapted to be held by suction on said second suction means.

* * * * *